United States Patent
Hey-Shipton

(10) Patent No.: US 9,825,611 B2
(45) Date of Patent: Nov. 21, 2017

(54) DUAL PASSBAND RADIO FREQUENCY FILTER AND COMMUNICATIONS DEVICE

(71) Applicant: Resonant Inc., Santa Barbara, CA (US)

(72) Inventor: Gregory L. Hey-Shipton, Santa Barbara, CA (US)

(73) Assignee: Resonant Inc., Santa Barbara, CA (US)

( * ) Notice: Subject to any disclaimer, the term of this patent is extended or adjusted under 35 U.S.C. 154(b) by 0 days.

(21) Appl. No.: 15/485,413

(22) Filed: Apr. 12, 2017

(65) Prior Publication Data

US 2017/0302252 A1  Oct. 19, 2017

Related U.S. Application Data

(60) Provisional application No. 62/323,414, filed on Apr. 15, 2016.

(51) Int. Cl.
| | |
|---|---|
| *H04M 1/00* | (2006.01) |
| *H03H 9/64* | (2006.01) |
| *H04B 1/3827* | (2015.01) |
| *H04B 1/40* | (2015.01) |

(52) U.S. Cl.
CPC ........ *H03H 9/6409* (2013.01); *H03H 9/6483* (2013.01); *H04B 1/3833* (2013.01); *H04B 1/40* (2013.01)

(58) Field of Classification Search
CPC .............................. H04B 1/3833; H04B 1/40
USPC ....................................................... 455/550.1
See application file for complete search history.

(56) References Cited

U.S. PATENT DOCUMENTS

| | | | |
|---|---|---|---|
| 8,701,065 B1 | 4/2014 | Silver | |
| 8,751,993 B1 | 6/2014 | Fenzi et al. | |
| 8,990,742 B2 | 3/2015 | Turner et al. | |
| 9,038,005 B2 | 5/2015 | Turner et al. | |
| 9,165,101 B2 | 10/2015 | Turner et al. | |
| 9,208,274 B2 | 12/2015 | Turner et al. | |
| 9,325,294 B2 | 4/2016 | Silver et al. | |
| 9,331,669 B2 | 5/2016 | Costa et al. | |
| 9,369,111 B1 * | 6/2016 | McHugh | H03H 9/02543 |
| 9,374,061 B1 | 6/2016 | Costa et al. | |
| 9,391,351 B2 * | 7/2016 | Raihn | H01P 1/20381 |
| 9,524,360 B2 | 12/2016 | Turner et al. | |
| 9,525,393 B1 | 12/2016 | Raihn et al. | |
| 9,608,595 B1 | 3/2017 | Raihn et al. | |
| 9,654,078 B1 | 5/2017 | Raihn et al. | |
| 2012/0249263 A1 * | 10/2012 | Zhang | H04B 1/0057 333/132 |
| 2014/0340159 A1 * | 11/2014 | Schmid | H03F 3/19 330/306 |
| 2017/0083649 A1 * | 3/2017 | Yang | G06F 1/26 |

* cited by examiner

*Primary Examiner* — Raj Chakraborty
(74) *Attorney, Agent, or Firm* — SoCal IP Law Group LLP; John E. Gunther; Steven C. Sereboff

(57) ABSTRACT

Multi-band filters and communications devices are disclosed. A multi-band filter has a lower pass-band and an upper pass-band separated by an intervening stop-band. The multi-band filter includes a first ladder network and a second ladder network coupled in series. The first ladder network is configured to provide transmission zeros at frequencies below a lower edge of the lower pass-band and transmission zeros at frequencies above an upper edge of the upper pass-band. The second ladder network is configured to provide transmission zeros at frequencies within the intervening stop-band.

7 Claims, 13 Drawing Sheets

© 2017 Resonant Inc.

ial application 62/323,414, filed Apr. 15, 2016, titled MULTI-PASS-BAND FILTERS FOR MOBILE DEVICE RF FRONT ENDS.

DUAL PASSBAND RADIO FREQUENCY FILTER AND COMMUNICATIONS DEVICE

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent claims priority from provisional patent application 62/323,414, filed Apr. 15, 2016, titled MULTI-PASS-BAND FILTERS FOR MOBILE DEVICE RF FRONT ENDS.

BACKGROUND

Field

This disclosure relates to radio frequency filters using surface acoustic wave (SAW) resonators, and specifically to filters for use in communications equipment.

Description of the Related Art

A radio frequency (RF) filter is a two-terminal device configured to pass some frequencies and to stop other frequencies, where "pass" means transmit with relatively low insertion loss and "stop" means block or substantially attenuate. The range of frequencies passed by a filter is referred to as the "pass-band" of the filter. The range of frequencies stopped by such a filter is referred to as the "stop band" of the filter. A typical RF filter has at least one pass-band and at least one stop-band. Specific requirements on a pass-band or stop-band depend on the specific application. For example, a "pass-band" may be defined as a frequency range where the insertion loss of a filter is less than a defined value such as one dB, two dB, or three dB. A "stop-band" may be defined as a frequency range where the insertion loss of a filter is greater than a defined value such as twenty dB, twenty-five dB, forty dB, or greater depending on application.

RF filters are used in communications systems where information is transmitted over wireless links. For example, RF filters may be found in the RF front-ends of base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between such performance parameters as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

Surface acoustic wave (SAW) resonators are used in a variety of RF filters including band-reject filters, band-pass filters, duplexers, and multiplexers. A duplexer is a radio frequency filter device that allows simultaneous transmission in a first frequency band and reception in a second frequency band (different from the first frequency band) using a common antenna. A multiplexer is a radio frequency filter with more than two input or output ports with multiple pass-bands. A triplexer is a four-port multiplexer with three pass-bands.

As shown in FIG. 1, a typical SAW resonator 100 is formed by thin film conductor patterns formed on a surface of a substrate 105 made of a piezoelectric material such as quartz, lithium niobate, lithium tantalate, or lanthanum gallium silicate. The substrate 105 is commonly a single-crystal slab of the piezoelectric material, or a composite substrate including a thin single-crystal wafer of the piezoelectric material bonded to another material such as silicon, sapphire, or quartz. A composite substrate is commonly used to provide a thermal expansion coefficient different from the thermal expansion coefficient of the single-crystal piezoelectric material alone. A first inter-digital transducer (IDT) 110 includes a plurality of parallel conductors. A radio frequency or microwave signal applied to the first IDT 110 via an input terminal IN generates an acoustic wave on the surface of the substrate 105. As shown in FIG. 1, the surface acoustic wave will propagate in the left-right direction. A second IDT 120 converts the acoustic wave back into a radio frequency or microwave signal at an output terminal OUT. The conductors of the second IDT 120 are interleaved with the conductors of the first IDT 110 as shown. In other typical SAW resonator configurations (not shown), the conductors forming the second IDT are disposed on the surface of the substrate 105 adjacent to, or separated from, the conductors forming the first IDT. Also, extra fingers (commonly called "dummy" fingers) are sometimes formed opposite to the ends of the IDT fingers and connected to the IN and OUT bus bars of the first and second IDTs 110 and 120. Grating reflectors 130, 135 are disposed on the substrate to confine most of the energy of the acoustic waves to the area of the substrate occupied by the first and second IDTs 110, 120. The grating reflectors 130, 135 float or are connected to either the IN terminal or the OUT terminal. In general, the SAW resonator 100 is bi-directional, and the IN and OUT terminal designations may be transposed.

The electro-acoustic coupling between the first IDT 110 and the second IDT 120 is highly frequency-dependent. The basic behavior of acoustic resonators (SAW, bulk acoustic wave, film bulk acoustic wave, etc.) is commonly described using the Butterworth Van Dyke (BVD) circuit model as shown in FIG. 2A. The BVD circuit model consists of a motional arm and a static arm. The motional arm includes a motional inductance $L_m$, a motional capacitance $C_m$, and a resistance $R_m$. The static arm includes a static capacitance $C_0$ and a resistance $R_0$. While the BVD model does not fully describe the behavior of an acoustic resonator, it does a good job of modeling the two primary resonances that are used to design band-pass filters, duplexers, and multiplexers (multiplexers are filters with more than 2 input or output ports with multiple pass-bands).

The first primary resonance of the BVD model is the motional resonance caused by the series combination of the motional inductance $L_m$ and the motional capacitance $C_m$. The second primary resonance of the BVD model is the anti-resonance caused by the combination of the motional inductance $L_m$, the motional capacitance $C_m$, and the static capacitance $C_0$. In a lossless resonator ($R_m$=$R_0$=0), the frequency $F_r$ of the motional resonance is given by $$F_r = \frac{1}{2\pi\sqrt{L_m C_m}} \quad (1)$$

The frequency $F_a$ of the anti-resonance is given by $$F_a = F_r\sqrt{1 + \frac{1}{\gamma}} \quad (2)$$

where $\gamma = C_0/C_m$ is a characteristic of the substrate upon which the SAW resonator is fabricated. $\gamma$ is dependent on both the material and the orientation of the crystalline axes of the substrate, as well as the physical design of the IDTs.

The frequencies of the motional resonance and the anti-resonance are determined primarily by the pitch and orientation of the interdigitated conductors, the choice of substrate material, and the crystallographic orientation of the substrate material.

FIG. 2B is a plot of the admittance of a theoretical lossless acoustic resonator. The admittance exhibits a motional resonance 212 where the admittance of the resonator approaches infinity, and an anti-resonance 214 where the admittance of the resonator approaches zero. In over-simplified terms, the lossless acoustic resonator can be considered a short circuit at the frequency of the motional resonance 212 and an open circuit at the frequency of the anti-resonance 214. The frequencies of the motional resonance 212 and the anti-resonance 214 are representative, and a resonator may be designed for other frequencies.

Cellular telephones operate in various bands defined by industry or governmental standards. For example, the 3GPP LTE (Third Generation Partnership Project Long Term Evolution) standard defines 48 different bands over a frequency range of about 450 MHz to greater than 5000 MHz. Each of these bands consists of a frequency range or a pair of disjoint frequency ranges used for cellular telephone communications. For example, Band 12, which is used in the United States and Canada, employs the frequency range from 699 MHz to 716 MHz for communications from the cellular device to the cellular network and the frequency range from 729 MHz to 746 MHz for communications from the network to the device. Band 40, used in several countries in Asia, employs the frequency range from 2300 MHz to 2400 MHz for communications in both directions. All of bands defined by the 3GPP LTE standard are not currently in use, and only one or a few bands are typically used in any particular country. Further, different cellular service providers in a given country may each have frequency allocations within one or multiple bands.

Antenna diversity uses two or more antennas to improve the quality and reliability of a wireless link. In urban and indoor environments, a transmitted signal may be reflected along multiple paths before finally being received. Each of these reflections introduces a phase shift or time delay Such that signals reflected along differ paths may destructively interfere with one another at the receiving antenna. This situation, commonly called "multipath fading," can result in communications drop-outs.

The use of multiple, physically separated, antennas on a communications device is an effective technique for mitigating multipath fading. Each antenna will experience a different interference environment. If one antenna is subject to severe multipath fading, it is likely that a second antenna disposed a short distance from the first antenna will have a sufficient signal. Current communications devices, such as cellular telephones, typically include a second antenna and a second receiver chain to improve call reliability. The second antenna and receiver chain are commonly referred to as a "diversity receiver."

In order to increase data rate, a technique called carrier aggregation may also be used. Carrier aggregation uses multiple bands simultaneously for the transmission and reception of data, thereby increasing the data throughput rate. When receiving data transmitted using carrier aggregation, it may be advantageous for the receiver to include a single filter with multiple pass-bands matching the multiple bands being transmitting.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 3:
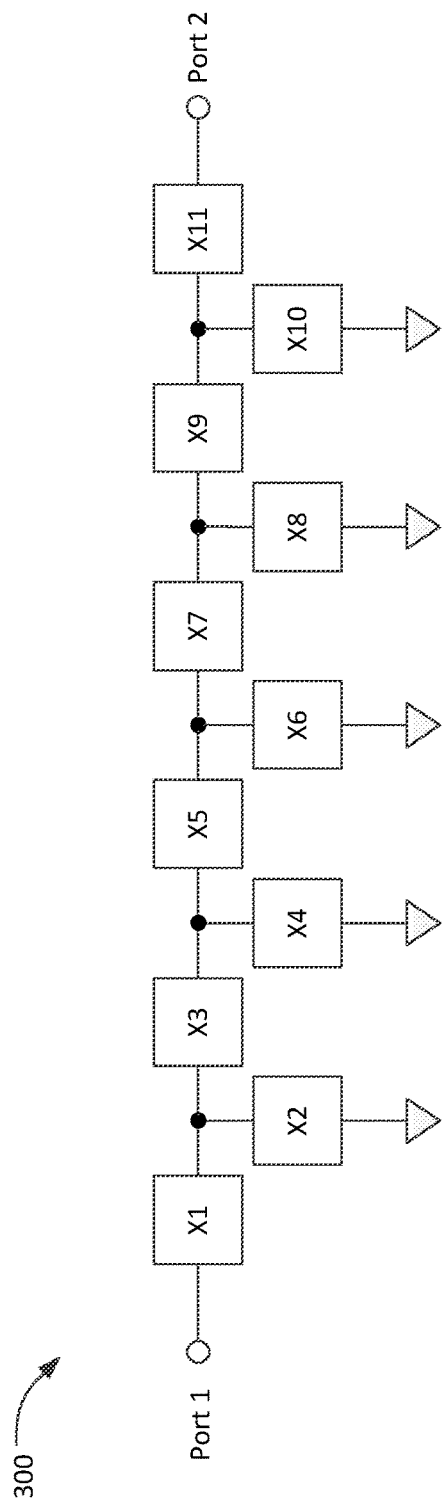
FIG. 3 is a schematic diagram of a conventional SAW filter.

FIG. 3 shows a schematic diagram of an exemplary band-pass filter circuit 300 incorporating eleven SAW resonators, labeled X1 through X11, arranged in what is commonly called a "ladder" configuration. The filter circuit 300 may be, for example, a transmit filter or a receive filter for incorporation into a communications device. The filter circuit 300 includes six series resonators (X1, X3, X5, X7, X9, and X11) connected in series between an input (Port 1) and an output (Port 2). The filter circuit 300 includes five shunt resonators (X2, X4, X6, X8, and X10) connected between junctions of adjacent series resonators and ground. Shunt resonators may also be connected between ground and either or both of the input port and the output port. The use of eleven SAW resonators, six series resonators, and five shunt resonators is exemplary. A filter circuit may include more or fewer than eleven SAW resonators and a different arrangement of series and shunt resonators. Although not shown in FIG. 3 or any of the other schematic diagrams in this patent, filter circuits may also include reactive components such as inductors and capacitors.

Figure 1:
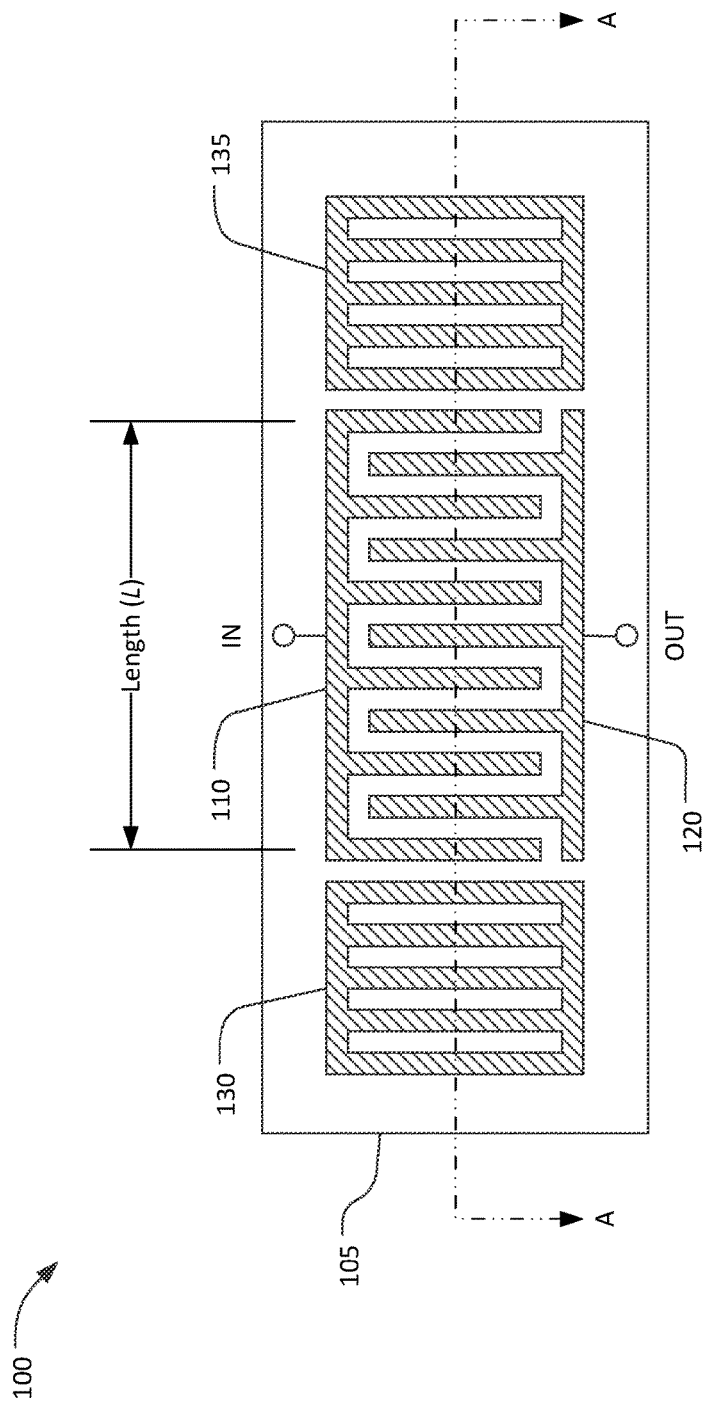
FIG. 1 is a simplified schematic plan view of a SAW resonator.

Each of the eleven resonators X1-X11 may be comprised of inter-digital transducers and grating reflectors as shown in FIG. 1. Each of the eleven resonators X1-X11 may have a corresponding motional resonant frequency, F1-F11. The motional resonant frequencies F1-F11 may all be different. The motional resonant frequencies of some of the resonators X1-X11 may be the same. Typically, the motional resonant frequencies F2, F4, F6, F8, F10 of the shunt resonators are offset from the motional resonant frequencies F1, F3, F5, F7, F9, F11 of the series resonators.

Assuming the resonators X1-X11 are lossless, each shunt resonator X2, X4, X6, X8, and X10 acts as a short circuit at its respective motional resonant frequency, and each series resonator X1, X3, X5, X7, X9, and X11 acts as an open circuit at its respective anti-resonant frequency. Considering the filter circuit 300 as a whole, it can be understood that the attenuation of the filter from input to output is infinite (under the assumption that the resonators are lossless) at the motional resonant frequencies of the shunt resonators and the anti-resonant frequencies of the series resonators. These frequencies are commonly called attenuation poles or, equivalently, transmission zeros. The pass-band of the filter circuit 300 is a frequency range between the high and low side transmission zeros. In a typical ladder band-pass filter design, the motional resonant frequencies of series resonators fall within a pass-band frequency range, the anti-resonant frequencies of series resonators create transmission zeros above the pass-band frequency range. The opposite is true for shunt resonators. The anti-resonant frequencies of shunt resonators are within the pass-band frequency range, and the motional resonant frequencies of shunt resonators create transmission zeros below the pass-band frequency range.

Figure 4:
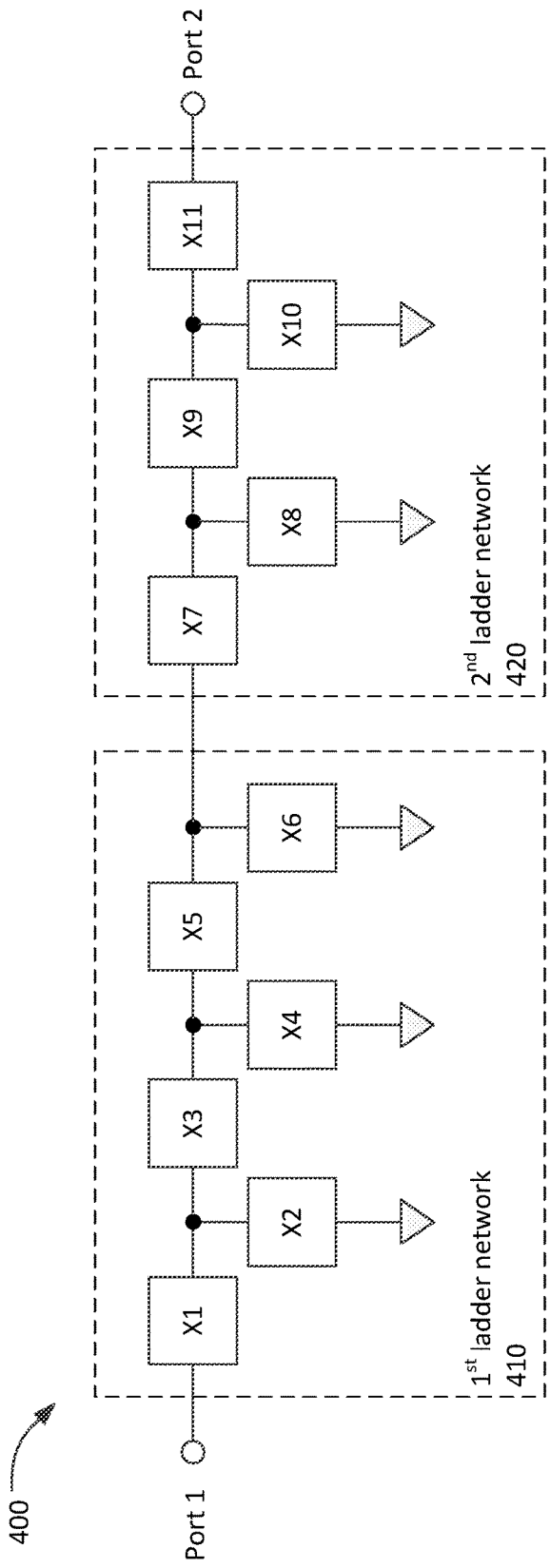
FIG. 4 is a schematic diagram of a dual band-pass SAW filter.

FIG. 4 shows a schematic diagram of an exemplary dual band-pass filter circuit 400 including a first ladder network 410 in series with a second ladder network 420. In this example, the first ladder network 410 includes three series resonators X1, X3, X5, and three shunt resonators X2, X4, X6. The second ladder network includes three series resonators X7, X9, X11, and two shunt resonators X8, X10. Each of the eleven resonators X1-X11 may be comprised of inter-digital transducers and grating reflectors as shown in FIG. 1. Each of the eleven resonators X1-X11 has a corresponding motional resonant frequency, F1-F11. Each shunt resonator X2, X4, X6, X8, and X10 causes a transmission zero at its respective motional resonant frequency, and each series resonator X1, X3, X5, X7, X9, and X11 causes a transmission zero at its respective anti-resonant frequency.

Figure 5:
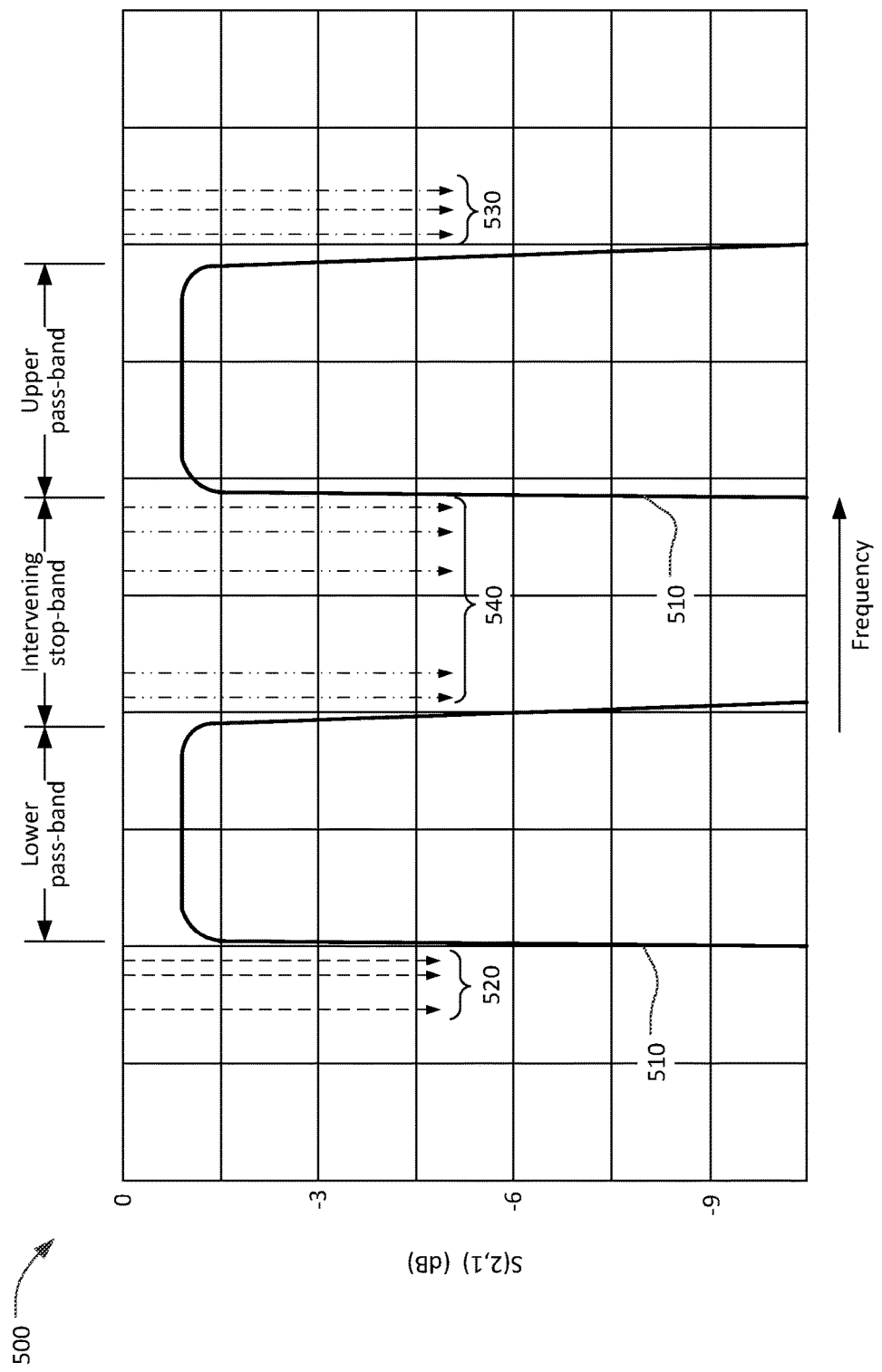
FIG. 5 is a chart showing the input-output transfer function of a hypothetical dual band-pass SAW filter.

FIG. 5 is a graph 500 of the S(2,1) parameter of a hypothetical embodiment of the dual pass-band filter 400. S-parameters are a convention used to describe the performance of linear electrical networks. The solid line 510 is a plot of S(2,1), which is the voltage transfer function from port 1 to port 2 of the dual pass-band filter. S(2,1) is often expressed in dB, which is 20 $\log_{10}$[S(2,1)], and is essentially the power gain of the device. However, passive devices like SAW filters are usually characterized by the "insertion loss" of the filter, which is numerically the same as the power gain, but with a change in numeric sign (e.g. S(2,1)=−3 dB is equivalent to an insertion loss of 3 dB). In this case, the solid line 510 plots the input-to-output transfer function of the filter 400. As shown, the filter 400 has low insertion loss in a lower pass-band and an upper pass-band, where "lower" and "upper" refer to the relative frequencies of the pass-bands. The lower and upper pass-bands are separated by an intervening stop-band, where an "intervening stop band" is a stop band that lies between two passbands.

Also shown in the graph 500 are the frequency locations of transmission zeros created by either the motional resonance of shunt resonators, or the anti-resonance of series resonators. The transmission zero frequency locations as indicated by dashed and broken arrows extending downward from the top of the graph 500. These arrows are shown for convenience in understanding the shape of the transfer function, and are not part of the measured or simulated response of the dual pass-band filter 400.

Three dashed arrows 520 located below the lower edge of the lower pass-band represent transmission zeros caused by the motional resonances of the shunt resonators X2, X4, X6 in the first ladder network 410. Three broken (dash-dot) arrows 530 located above the upper edge of the upper pass-band represent transmission zeros caused by the anti-resonances of series resonators X1, X3, X5 in the first ladder network. Five broken (dash-dot-dot) arrows 540 located within the intervening stop band represent transmission zeros caused by the resonators X7 to X11 in the second ladder network. Typically, transmission zeros caused by the series resonators of the second ladder network are located near the lower side of the intervening stop-band (just above the upper edge of the lower pass-band) and transmission zeros caused by the shunt resonators of the second ladder network are located in the upper half of the intervening stop band (just below the lower edge of the upper pass-band).

The arrangement of series and shunt SAW resonators shown in FIG. 4 is exemplary. Each of the first and second ladder networks may include more or fewer SAW resonators and a different arrangement of series and shunt resonators. In all cases, shunt resonators in the first ladder network create transmission zeros at frequencies below the lower edge of the lower pass-band, series resonators in the first ladder network create transmission zeros at frequencies above the upper edge of the upper pass-band, and resonators in the second ladder network create transmission zeros within the intervening stop-band.

Example 1

Figure 6:
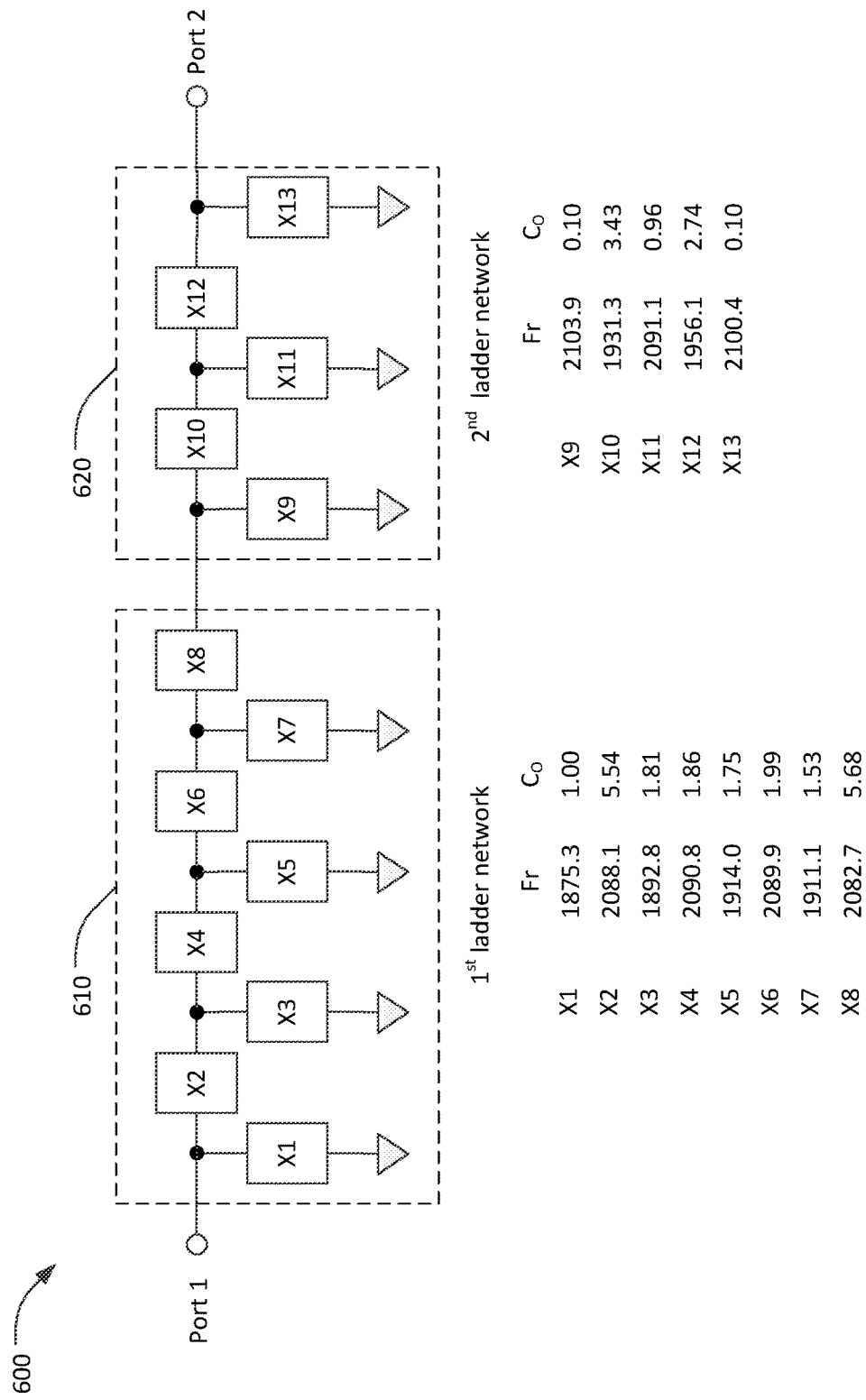
FIG. 6 is a schematic diagram of a Band 2/Band 4 dual band-pass SAW filter.

FIG. 6 shows a schematic diagram of band 2/band 4 dual band-pass filter 600 including a first ladder network 610 in series with a second ladder network 620. The filter 600 has a lower pass-band and an upper pass-band separated by an intervening stop band. The lower pass-band accommodates the LTE band 2 receive band from 1930 to 1990 MHz. The upper pass-band accommodates the LTE band 4 receive band from 2110 to 2155 MHz. LTE bands 2 and 4 are widely used for cellular communications in North and South America, but are merely exemplary of relevant bands. The system may be applied to different frequency bands with similar effect. In FIG. 6, the first ladder network 610 includes four shunt resonators X1, X3, X5, X7, and four series resonators X2, X4, X6, X8. The second ladder network includes three shunt resonators X9, X11, X13, and two series resonators X10, X12. Each of the thirteen resonators X1-X13 may be comprised of inter-digital transducers and grating reflectors as shown in FIG. 1. The motional resonance frequency Fr and the static capacitance $C_0$ is provided for each resonator.

Figure 7:
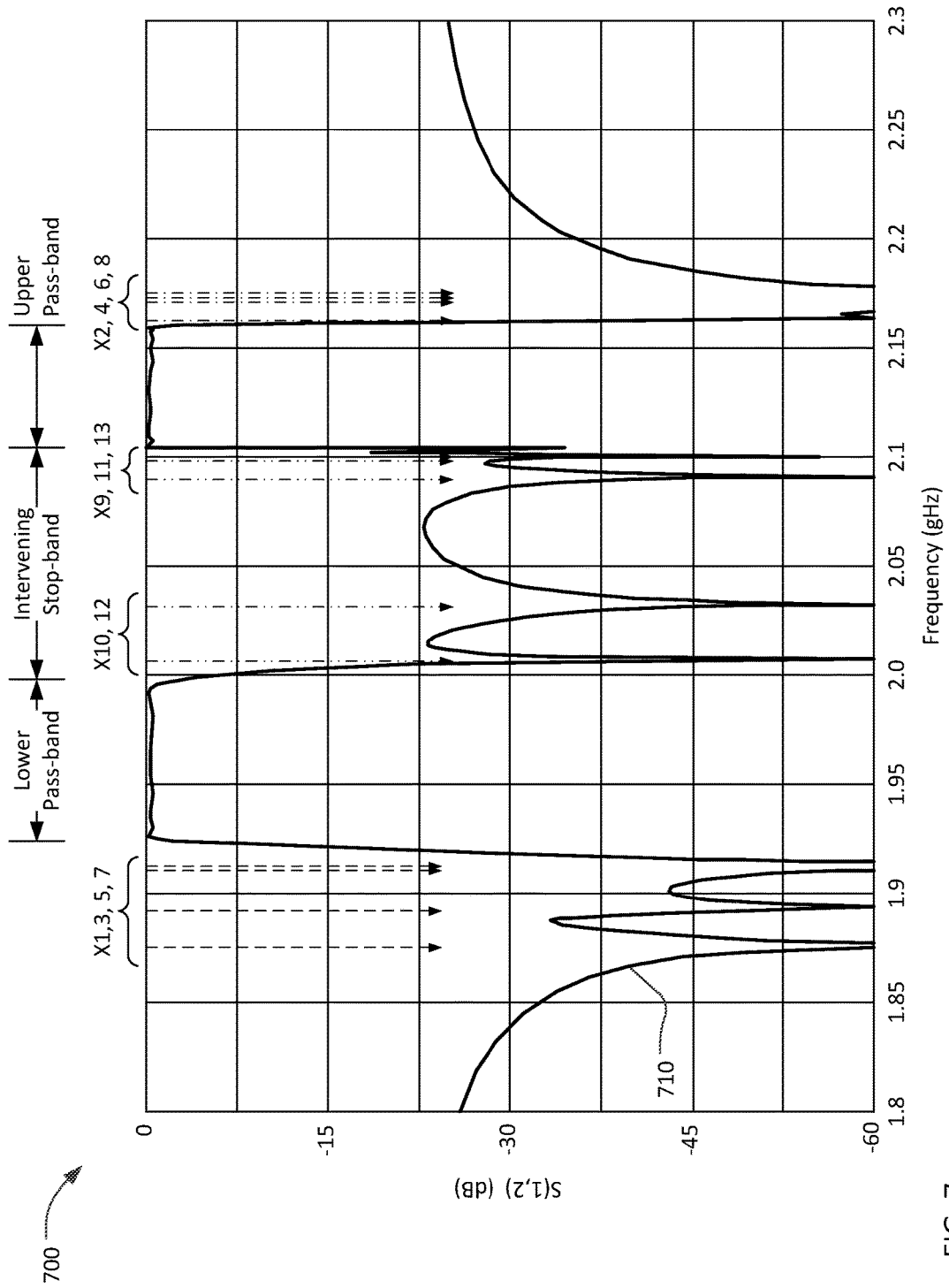
FIG. 7 is a chart showing the input-output transfer function of the Band 2/Band 4 dual band-pass SAW filter.

FIG. 7 is a graph 700 of the S(2,1) parameter of the band 2/band 4 dual pass-band filter 600. The solid line 710 is a plot of S(2,1), which is the voltage transfer function from port 1 to port 2 of the dual pass-band filter 700.

Also shown in the graph 700 are the frequency locations of transmission zeros created by either the motional resonance of shunt resonators, or the anti-resonance of series resonators. The transmission zero frequency locations as indicated by dashed and broken arrows extending downward from the top of the graph 700. These arrows are shown for convenience in understanding the shape of the transfer function, and are not part of the measured or simulated response of the dual pass-band filter 700.

Four dashed arrows located below the lower edge of the lower pass-band represent transmission zeros caused by the motional resonances of the shunt resonators X1, X3, X5, X7 in the first ladder network 610. Four broken (dash-dot) arrows located above the upper edge of the upper pass-band represent transmission zeros caused by the anti-resonances of series resonators X2, X4, X6, X8 in the first ladder network 610. Five broken (dash-dot-dot) arrows located within the intervening stop band represent transmission zeros caused by the resonators X9 to X13 in the second ladder network 620. As is typical, transmission zeros caused by the series resonators X10, X12 of the second ladder network 720 are located near the lower side of the intervening stop-band (just above the upper edge of the lower pass-band) and transmission zeros caused by the shunt resonators X9, X11, X13 of the second ladder 620 network are located in the upper half of the intervening stop band (just below the lower edge of the upper pass-band).

Example 2

Figure 8:
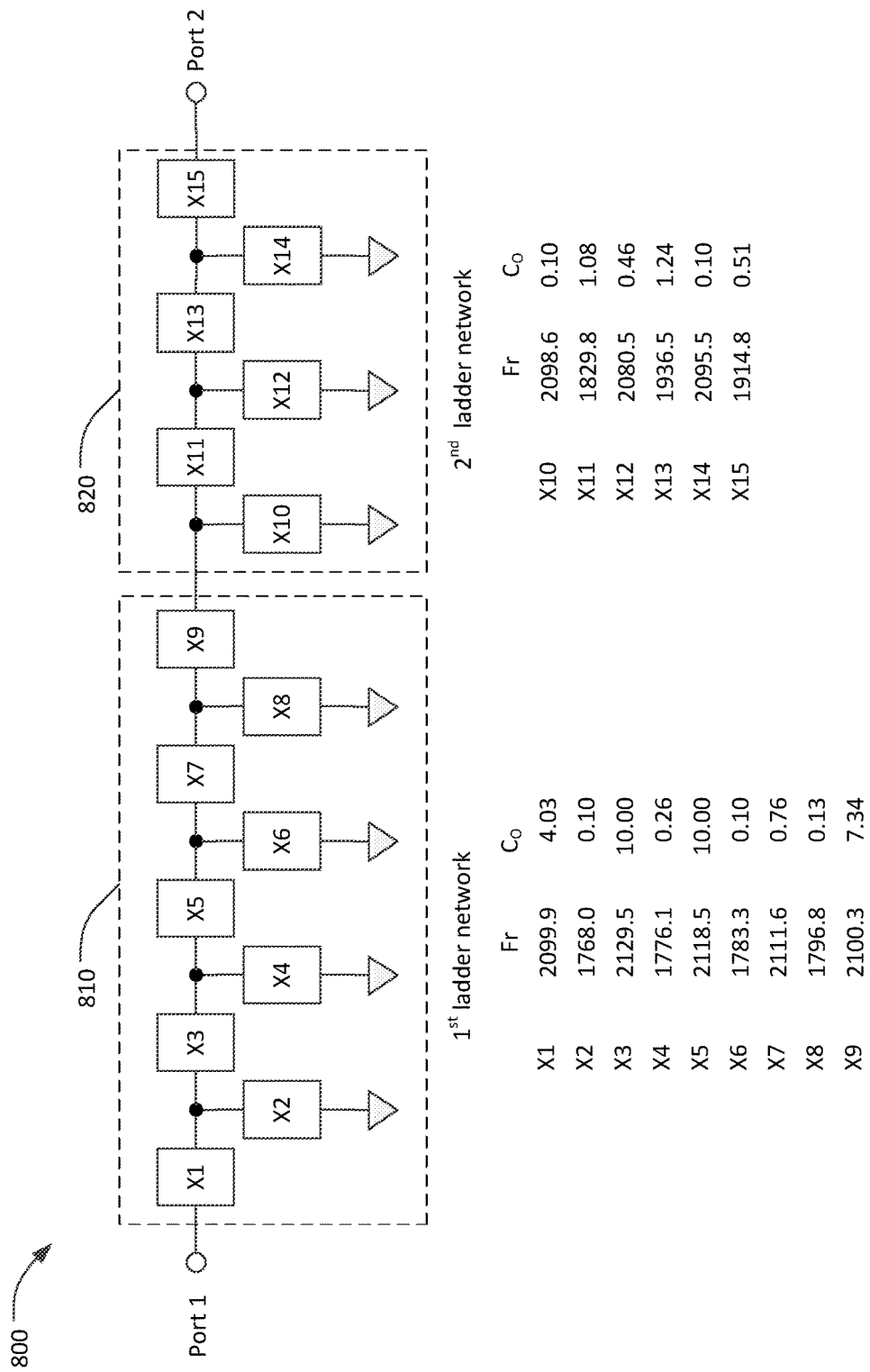
FIG. 8 is a schematic diagram of a Band1/Band3 dual band-pass SAW filter.

FIG. 8 shows a schematic diagram of band 1/band 3 dual band-pass filter 800 including a first ladder network 810 in series with a second ladder network 820. The filter 800 has a lower pass-band and an upper pass-band separated by an intervening stop band. The lower pass-band accommodates the LTE band 3 receive band from 1805 to 1880 MHz. The upper pass-band accommodates the LTE band 1 receive band from 2110 to 2170 MHz. LTE bands 1 and 3 are widely used for cellular communications in Asia and Europe. The first ladder network 810 includes five series resonators X1, X3, X5, X7, X9 and four shunt resonators X2, X4, X6, X8. The second ladder network includes three shunt resonators X10, X12, X15, and three series resonators X11, X13, X15. Each of the fifteen resonators X1-X15 may be comprised of inter-digital transducers and grating reflectors as shown in FIG. 1. The motional resonance frequency Fr and the static capacitance $C_0$ is provided for each resonator.

Figure 9:
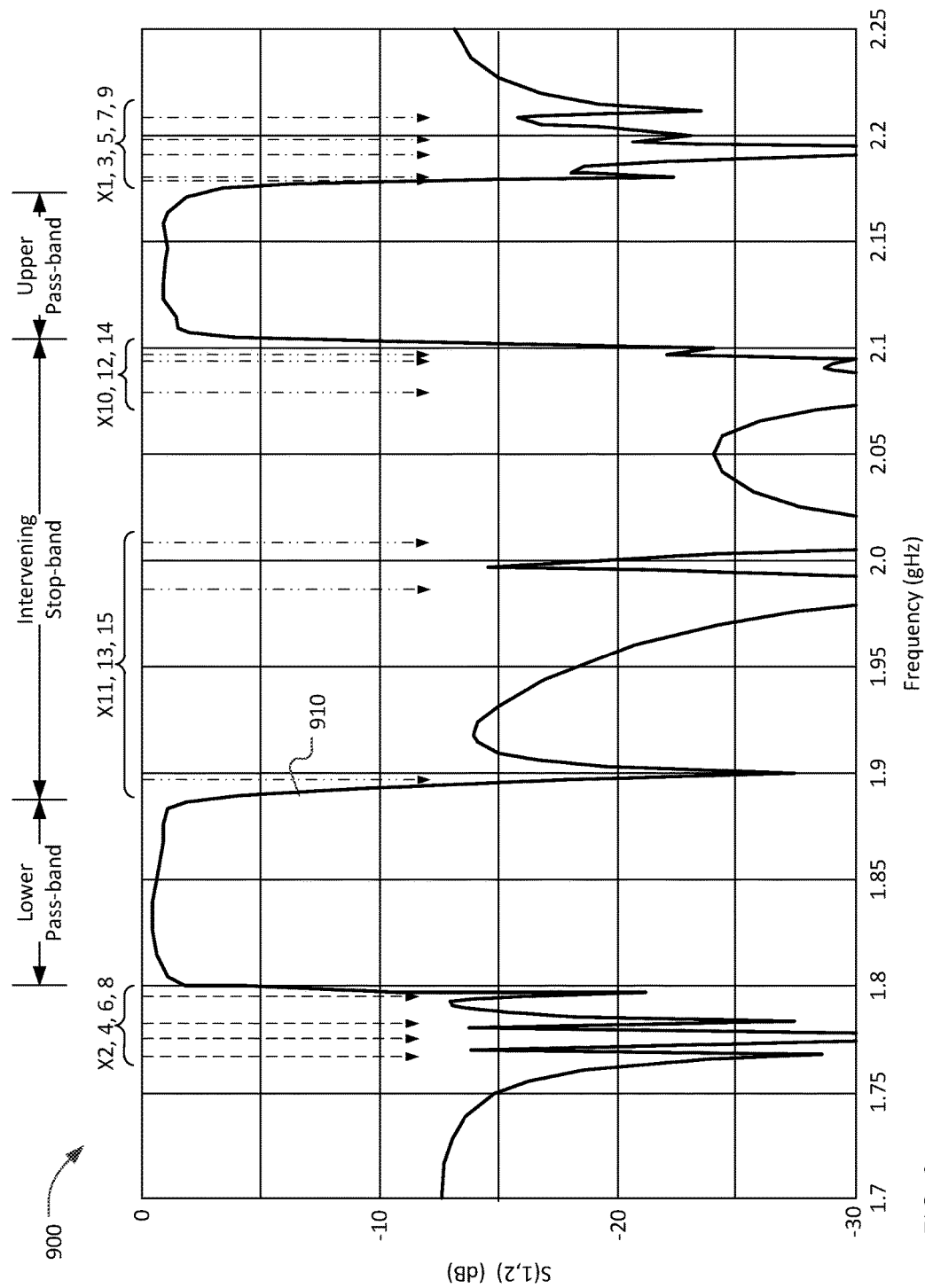
FIG. 9 is a chart showing the input-output transfer function of the Band 1/Band 3 dual band-pass SAW filter.

FIG. 9 is a graph 900 of the S(2,1) parameter of the band 1/band 3 dual pass-band filter 800. The solid line 910 is a plot of S(2,1), which is the voltage transfer function from port 1 to port 2 of the dual pass-band filter 800.

Also shown in the graph 900 are the frequency locations of transmission zeros created by either the motional resonance of shunt resonators, or the anti-resonance of series resonators. The transmission zero frequency locations as indicated by dashed and broken arrows extending downward from the top of the graph 900. These arrows are shown for convenience in understanding the shape of the transfer function, and are not part of the measured or simulated response of the dual pass-band filter 800.

Four dashed arrows located below the lower edge of the lower pass-band represent transmission zeros caused by the motional resonances of the shunt resonators X2, X4, X6, X8 in the first ladder network 810. Five broken (dash-dot) arrows located above the upper edge of the upper pass-band represent transmission zeros caused by the anti-resonances of series resonators X1, X3, X5, X7, X9 in the first ladder network 810. Six broken (dash-dot-dot) arrows located within the intervening stop band represent transmission zeros caused by the resonators X10 to X15 in the second ladder network 820. As is typical, transmission zeros caused by the series resonators X11, X13, X15 of the second ladder network 820 are located near the lower side of the intervening stop-band (just above the upper edge of the lower pass-band) and transmission zeros caused by the shunt resonators X10, X112, X14 of the second ladder 820 network are located in the upper half of the intervening stop band (just below the lower edge of the upper pass-band).

Example 3

Figure 10:
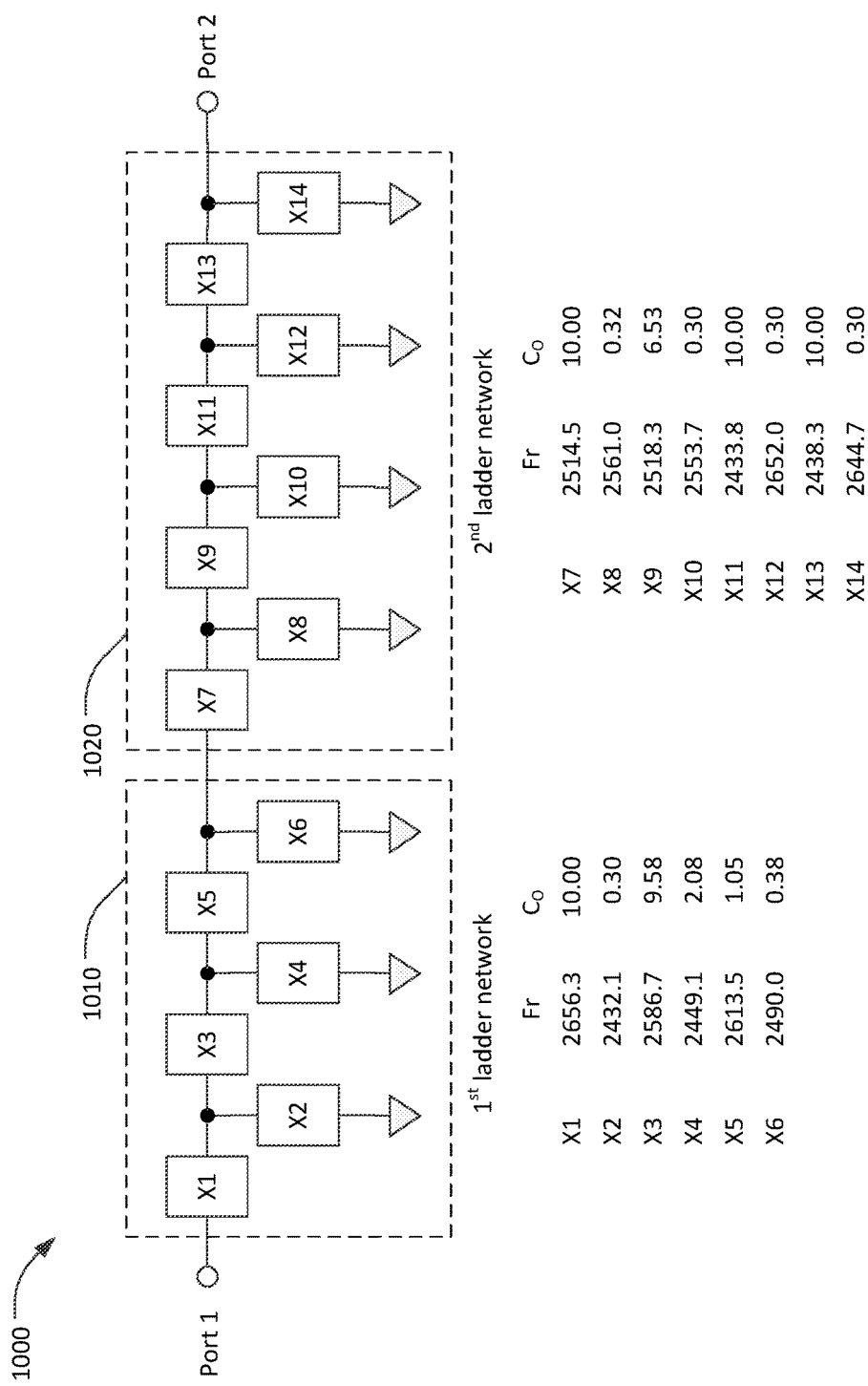
FIG. 10 is a schematic diagram of a three-band SAW filter.

FIG. 10 shows a schematic diagram of an exemplary three-band filter 1000 including a first ladder network 1010 and a second ladder network 1020 in series between an input port (Port 1) and an output port (Port 2). The first ladder network 1010 includes three series resonators X1, X3, X5 and three shunt resonators X2, X4, X6. The second ladder network 1020 includes four series resonators X7, X9, X11, X13 and four shunt resonators X8, X10, X12, X14. Each of the fourteen resonators X1-X14 may be comprised of inter-digital transducers and grating reflectors as shown in FIG. 1. The motional resonance frequency Fr and the static capacitance $C_0$ is provided for each resonator.

Figure 11:
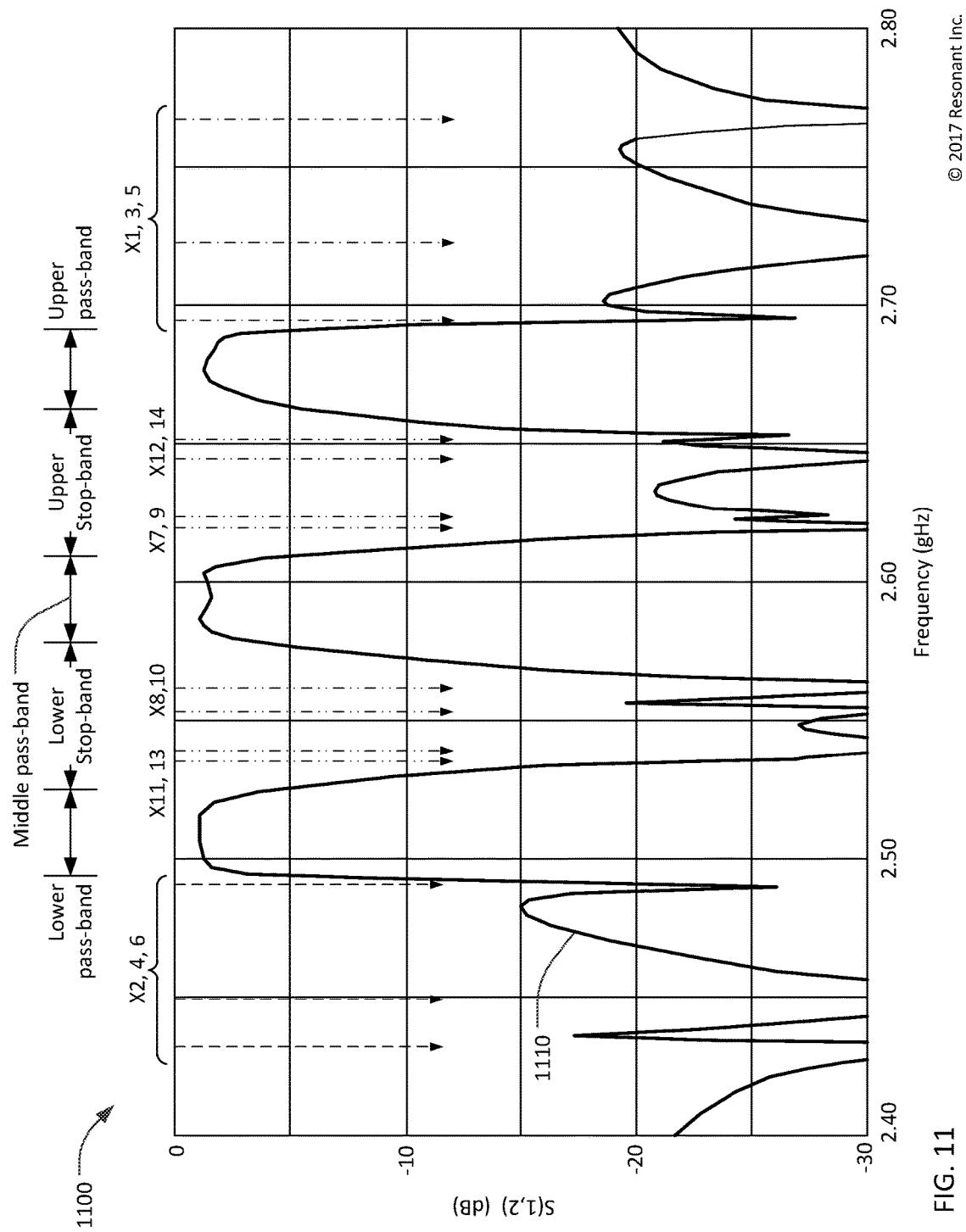
FIG. 11 is a chart showing the input-output transfer function of the three-band SAW filter.

FIG. 11 is a graph 1100 of the S(2,1) parameter of the three-band filter 1000. The solid line 1010 is a plot of S(2,1), which is the voltage transfer function from port 1 to port 2 of the three-band filter 1000. The filter 1000 has a lower pass-band, a middle pass-band, and an upper pass-band separated by lower and upper intervening stop bands.

Also shown in the graph 1100 are the frequency locations of transmission zeros created by either the motional resonance of shunt resonators, or the anti-resonance of series resonators. The transmission zero frequency locations as indicated by dashed and broken arrows extending downward from the top of the graph 1100. These arrows are shown for convenience in understanding the shape of the transfer function, and are not part of the measured or simulated response of the three-band filter 1000.

Three dashed arrows located below the lower edge of the lower pass-band represent transmission zeros caused by the motional resonances of the shunt resonators X2, X4, X6, in the first ladder network 1010. Three broken (dash-dot) arrows located above the upper edge of the upper pass-band represent transmission zeros caused by the anti-resonances of series resonators X1, X3, X5, in the first ladder network 1010. Eight broken (dash-dot-dot) arrows located within the lower and upper intervening stop band represent transmission zeros caused by the resonators X7 to X14 in the second ladder network 1020. Specifically, transmission zeros caused by the series resonators X11, X13 are located near the lower side of the lower intervening stop-band (just above the upper edge of the lower pass-band) and transmission zeros caused by the shunt resonators X8, X10 are located in the upper half of the lower intervening stop band (just below the lower edge of the middle pass-band). Transmission zeros caused by the series resonators X7, X9 are located near the lower side of the upper intervening stop-band (just above the upper edge of the middle pass-band) and transmission zeros caused by the shunt resonators X12, X14 are located in the upper half of the upper intervening stop band (just below the lower edge of the upper pass-band).

Figure 12A:
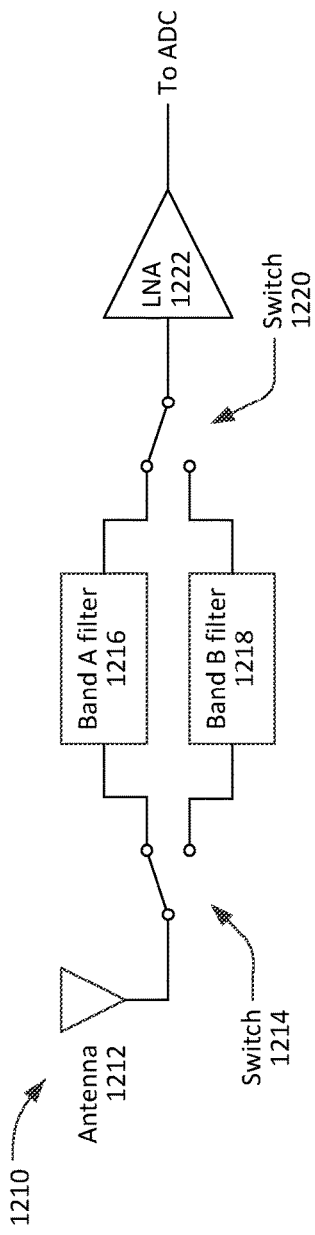
FIG. 12A is a block diagram of a conventional RF front end.

FIG. 12A is a block diagram of a portion of a diversity receiver 1210 for a communications device. In this example, the diversity receiver includes a first RF switch 1214 that directs a signal from an antenna 1212 to a selected one of a Band A filter 1216 and a Band B filter 1218, where "Band A" and "Band B" may be any two of the numbered LTE bands. A second RF switch 1220 directs the output from the selected filter to a low noise amplifier (LNA) 1222.

Figure 12B:
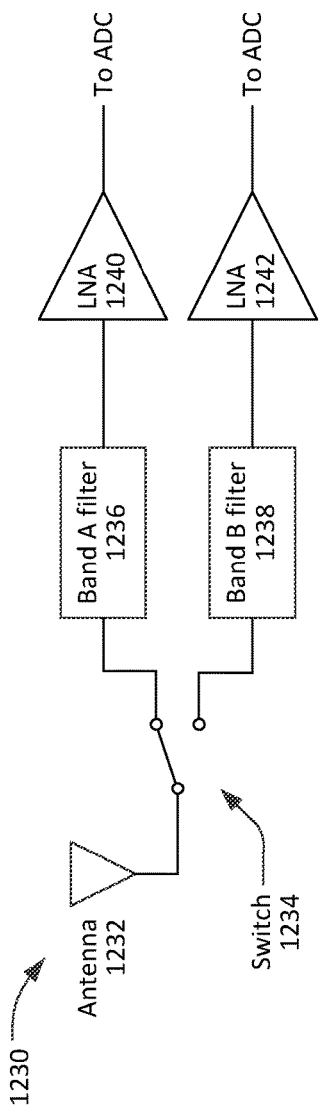
FIG. 12B is a block diagram of another conventional RF front end.

FIG. 12B is a block diagram of a portion of another diversity receiver 1230 for a communications device. In this example, the diversity receiver includes a first RF switch 1234 that directs a signal from an antenna 1212 to a selected one of a Band A filter 1236 and a Band B filter 1238, where "Band A" and "Band B" may be any two of the numbered LTE bands. The outputs from the filters 1236, 1238 are amplified by respective LNAs 1240, 1242.

Figure 12C:
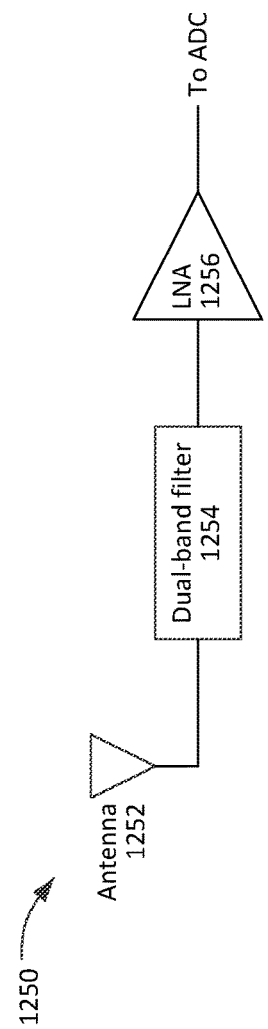
FIG. 12C is a block diagram of an RF front end including a dual band-pass filter.

FIG. 12C is a block diagram of a portion of an improved diversity receiver 1250 for a communications device. The improved diversity receiver includes an antenna 1252 coupled to an LNA 1256 through a dual-band filter 1254. The dual-band filter 1254 may be, for example, the Band 2/Band 4 filter 600 of FIG. 6 or the Band 1/Band 3 filter 800 of FIG. 8.

Comparison FIG. 12C with FIG. 12A and FIG. 12B shows that the improved diversity receiver 1250 requires fewer components and thus has a potential for reduced cost compared to the prior art diversity receivers 1210, 1230. Further, since RF switches are not required, the improved diversity receiver 1250 offers improved throughput between the antenna and LNA and corresponding higher signal-to-noise ratio at the input to the LNA. The receiver may also be used for carrier aggregation, where two receive bands are processed simultaneously, to increase the bandwidth used thereby increasing the data rate of the system.

Description of Methods

Figure 13:
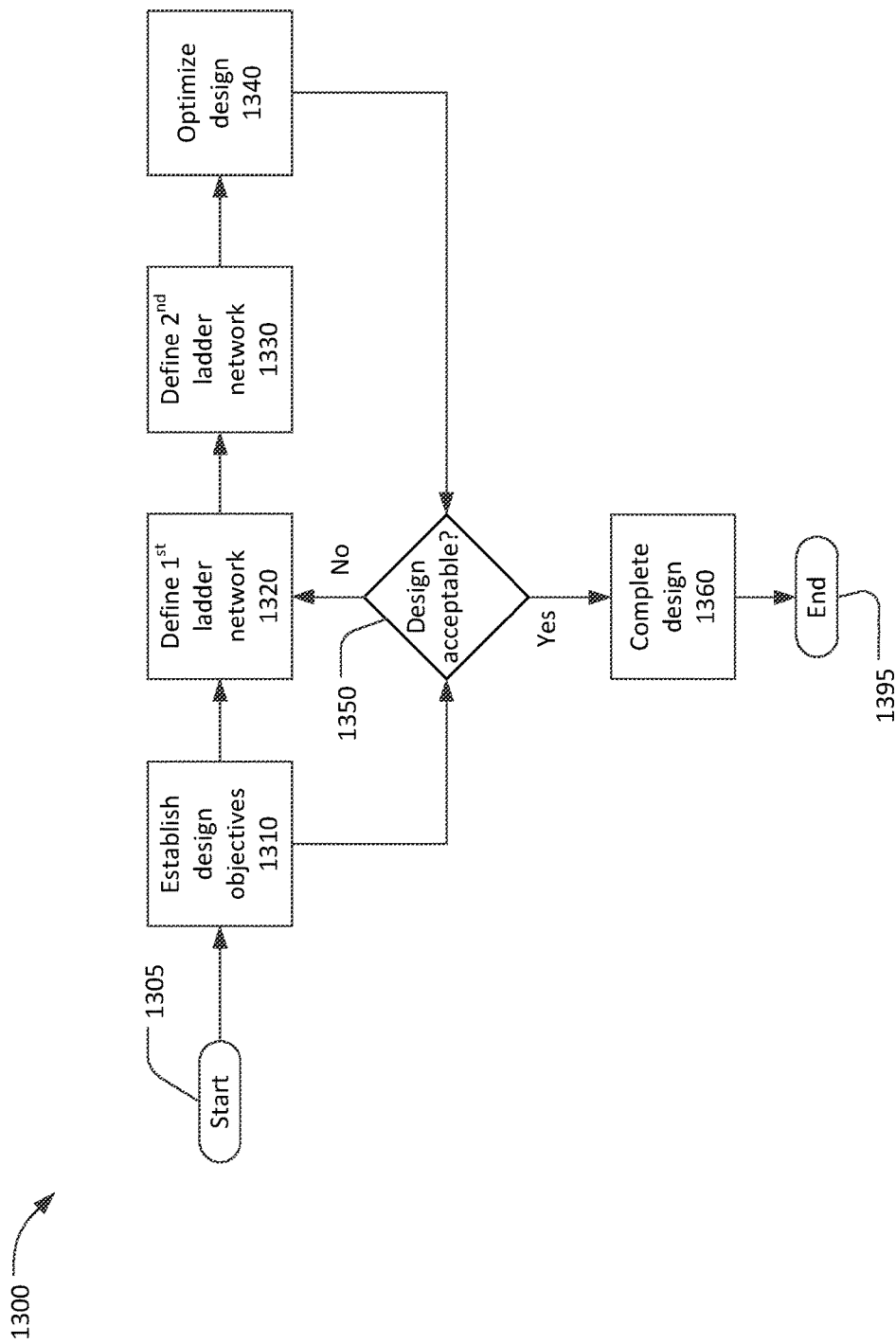
FIG. 13 is a flow chart of a method for designing a dual band-pass SAW filter.

FIG. 13 is a flow chart of a process 1300 for designing a multi-band filter. The process 1300 starts at 1305 with a specification on the filter to be designed. The process 1300 ends at 1395 upon completion of a satisfactory filter design. The process 1300 may be, in many cases, cyclic, with various steps of the process repeated iteratively to arrive at a satisfactory design.

The specification at 1305 may define both required and desired characteristics of the filter. Typically, the specification on a multi-band bandpass filter will define frequency ranges for a lower pass-band, an upper pass-band, and one or more stopband frequency ranges. The specification may define frequency ranges for one or more intermediate pass bands between the lower pass-band and the upper-pass-band. The specification may also define a maximum insertion loss over each passband frequency range, and/or a minimum insertion loss for each of the stopband frequency ranges. The specification may include other parameters such as a minimum return loss or maximum VSWR (voltage standing wave ratio) at the input and/or output of the filter over the passband frequency range when the filter is coupled to a particular impedance.

At 1310, a set of design objectives may be established based on the specification from 1305. Typically, the set of design objectives will include all of the required characteristics from the specification as well as targets for any desired characteristics. The set of design objectives may also include cost-driven targets such as a maximum number of resonators, a particular type of piezoelectric substrate, particular manufacturing processes, and/or a maxim piezoelectric substrate area.

At 1320, a first ladder network may be defined as an attempt to satisfy the design objectives from 1310. The definition of the first ladder network may include quantities of shunt resonators and series resonators and initial values for the motional resonant frequency or anti-resonant frequency of each resonator Specifically, initial values of the motional resonant frequencies of shunt resonators may be defined to provide transmission zeros below the lower edge of the lower pass-band, and initial values of the anti-resonant frequencies of series resonators may be defined to provide transmission zeros above the upper edge of the upper pass-band. The definition of the first ladder network at 1320 may be performed, for example, by a design engineer, possibly with the assistance of a software tool or "wizard" that suggests a number of resonators and motional resonant/anti-resonant frequencies based upon the design objectives from 1310.

At 1330, a second ladder network may be defined as an attempt to satisfy the design objectives from 1310. The definition of the second ladder network may include quantities of shunt resonators and series resonators and initial values for the motional resonant frequency or anti-resonant frequency of each resonator. Specifically, initial values of the motional resonant frequencies of shunt resonators and initial values of the anti-resonant frequencies of series resonators may be defined to provide transmission zeros within one or more stop-bands intermediate the upper and lower pass-bands. The definition of the second ladder network at 1330 may be performed, for example, by a design engineer, possibly with the assistance of a software tool if available.

Figure 2B:
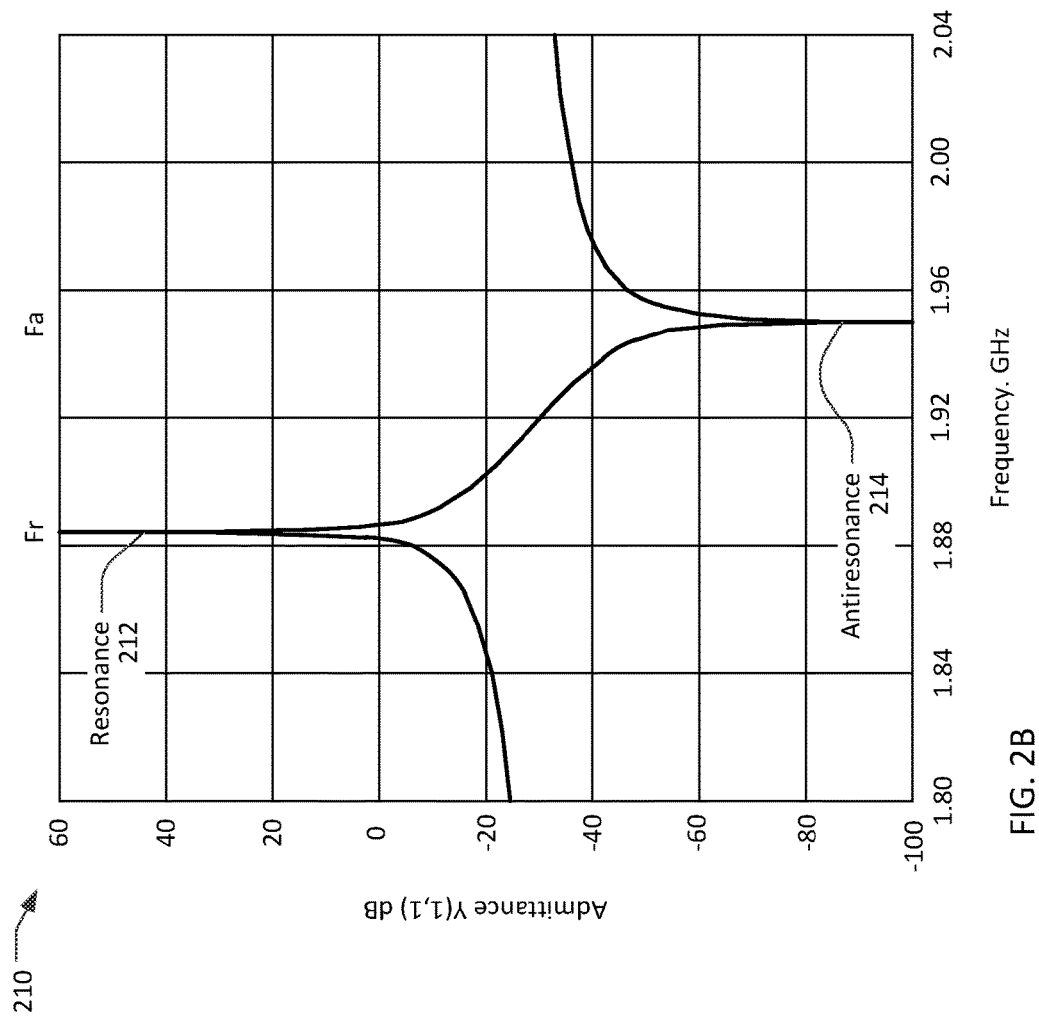
FIG. 2B is graph of the admittance of a lossless SAW resonator.
Figure 2A:
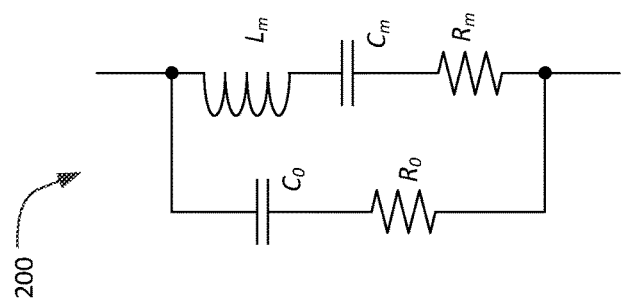
FIG. 2A is an equivalent circuit of a SAW resonator.

Starting with the definitions of the first ladder network and second ladder network from 1320 and 1330, the overall design of the multi-band filter is optimized at 1340. The design optimization at 1340 may be performed, for example, by the design engineer using a circuit design software tool and/or an electroacoustic (EA) analysis software tool. When a circuit design tool is used, the ladder filter is analyzed as an electronic circuit, with the SAW resonators represented by combinations of lumped capacitor, inductor, and resistor elements. For example, each resonator may be represented by a BVD model as previously shown in FIG. 2A. When an EA analysis tool is used, the filter is represented by models of the SAW resonator IDTs on a piezoelectric substrate. A preliminary design may be performed using a circuit analysis tool and then refined using an EA analysis tool. Either or both of circuit design tool and the EA analysis tool may be capable of automated optimization of the filter design to satisfy, to the extent possible, the design objectives. Although real resonators have loss, an initial filter design optimization at 1340 may be done assuming lossless resonators, with the loss effects added later in the design effort.

At 1350, a determination is made whether or not the optimized filter design from 1340 is acceptable, which is to say whether or not the filter design from 1340 satisfies (or is acceptably close to satisfying) the design objectives from 1310. When the filter design is satisfactory ("yes" at 1350), the design may be completed at 1360. Completing the design at 1360 may include, for example, defining a package for the filter and necessary interconnections within the package. Completing the design may also include adjusting the filter design if necessary to compensate for the effects (e.g. interconnection inductances and stray capacitances) of the package and interconnects. Once the design is completed at 1360, the process ends at 1395.

When a determination is made at 1350 that the filter design from 1340 is not acceptable ("no" at 1350), the process may return to 1320. The definitions of one or both the first ladder network and the second ladder network may be modified (for, example by adding one or more additional resonators) and the actions from 1320 to 1350 may be repeated until an acceptable filter design is established. In some circumstances, for example after multiple iterations of the actions from 1320 to 1350, the process may return to 1310 to re-establish the design objective for the multi-band filter. For example, the design objectives may be modified to allow a larger piezoelectric substrate area to accommodate more resonators or a different type of piezoelectric substrate to provide different resonator performance.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A communications device, comprising:
   a multi-band filter having a lower pass-band, a middle pass-band, and an upper pass-band, the lower pass-band and the middle pass band separated by an intervening lower stop-band, and the middle pass-band and the upper pass-band separated by an intervening upper stop-band, the multi-band filter comprising:
      a first ladder network and a second ladder network coupled in series between a first port and a second port, wherein
      the first ladder network is configured to provide transmission zeros at frequencies below a lower edge of the lower pass-band and transmission zeros at frequencies above an upper edge of the upper pass-band,
      the second ladder network comprises two or more second-network shunt resonators and two or more second-network series resonators, and
      respective motional resonant frequencies of each of the second-network shunt resonators and respective anti-resonant frequencies of each of the second network series resonators fall within one of the lower stop-band and the upper stop band.

2. The communications device of claim 1, wherein the first ladder network comprises:
   two or more first-network shunt resonators having respective motional resonant frequencies below the lower edge of the lower pass-band, and
   two or more first-network series resonators having respective anti-resonant frequencies above the upper edge of the upper pass-band.

3. The communications device of claim 1, wherein
   the first ladder network comprises three shunt resonators and three series resonators, and
   the second ladder network comprises four shunt resonators and four series resonators.

4. The communications device of claim 1, further comprising:
   an antenna coupled to the first port of the multi-band filter; and
   a low noise amplifier coupled to the second port of the multi-band filter.

5. The communications device of claim 4, wherein the antenna, the multi-band filter, and the low noise amplifier are a portion of a diversity receiver within a cellular telephone.

6. A method of designing a multi-band filter having a lower pass-band, a middle pass-band, and an upper pass-band, the lower pass-band and the middle pass band separated by an intervening lower stop-band, and the middle pass-band and the upper pass-band separated by an intervening upper stop-band, the method comprising:
   defining a first ladder network and a second ladder network coupled in series between a first port and a second port, wherein
   the first ladder network is defined to provide transmission zeros at frequencies below a lower edge of the lower pass-band and transmission zeros at frequencies above an upper edge of the upper pass-band, and
   the second ladder network is defined to comprise two or more second-network shunt resonators and two or more second-network series resonators, the method further comprising:
   selecting respective motional resonant frequencies of each of the second-network shunt resonators and respective anti-resonant frequencies of each of the second network series resonators to fall within one of the lower stop-band and the upper stop band.

7. The method of designing a multi-band filter of claim 6, wherein the first ladder network includes two or more first-network shunt resonators and two or more first-network series resonators, and the method further comprises:
 selecting respective motional resonant frequencies of the first-network shunt resonators below the lower edge of the lower pass-band, and
 selecting respective anti-resonant frequencies for the first-network series resonators above the upper edge of the upper pass-band.

\* \* \* \* \*